(12) United States Patent
Rana et al.

(10) Patent No.: US 11,563,373 B2
(45) Date of Patent: Jan. 24, 2023

(54) CIRCUIT AND METHOD FOR CONTROLLED DISCHARGE OF A HIGH (POSITIVE OR NEGATIVE) VOLTAGE CHARGE PUMP

(71) Applicant: STMicroelectronics International N.V., Geneva (CH)

(72) Inventors: Vikas Rana, Noida (IN); Neha Dalal, New Delhi (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/494,451

(22) Filed: Oct. 5, 2021

(65) Prior Publication Data

US 2022/0158550 A1     May 19, 2022

Related U.S. Application Data

(60) Provisional application No. 63/115,725, filed on Nov. 19, 2020.

(51) Int. Cl.
*H02M 3/07* (2006.01)
*G11C 5/14* (2006.01)

(52) U.S. Cl.
CPC .......... *H02M 3/07* (2013.01); *G11C 5/145* (2013.01); *H02M 3/071* (2021.05)

(58) Field of Classification Search
CPC .................. H02M 3/07; H02M 3/071
See application file for complete search history.

(56) References Cited

U.S. PATENT DOCUMENTS

| | | |
|---|---|---|
| 6,438,032 B1 | 8/2002 | Pekny |
| 6,836,442 B2 | 12/2004 | Micheloni et al. |
| 7,248,521 B2 | 7/2007 | Patel et al. |
| 7,272,053 B2 | 9/2007 | Choy |
| 7,280,407 B2 | 10/2007 | Umezawa et al. |
| 7,542,351 B2 | 6/2009 | Choy et al. |
| 7,724,581 B2 | 5/2010 | Ogiwara et al. |
| 7,863,967 B2 | 1/2011 | Crippa et al. |
| 10,749,429 B2 | 8/2020 | Harvey |
| 10,958,166 B1* | 3/2021 | Low ................... G05F 1/565 |
| 2007/0211502 A1 | 9/2007 | Komiya |
| 2010/0176872 A1* | 7/2010 | Saikusa ............ H02J 7/0044 327/536 |

(Continued)

FOREIGN PATENT DOCUMENTS

| | | |
|---|---|---|
| CN | 111509973 A | 8/2020 |
| JP | 2012160927 A | 8/2012 |

*Primary Examiner* — Sibin Chen
(74) *Attorney, Agent, or Firm* — Crowe & Dunlevy

(57) ABSTRACT

A charge pump circuit includes a first charge pump stage circuit coupled in series with a second charge pump stage circuit. A discharge circuit operates to discharge the charge pump circuit. The discharge circuit includes: a first switched circuit coupled to a first output of the first charge pump stage circuit and configured, when actuated, to discharge the first output; and a second switched circuit coupled to a second output of the second charge pump stage circuit and configured, when actuated, to discharge the second output. A discharge control circuit actuates the first switched discharge circuit to discharge the first output and then, after the first output is fully discharged, actuates the second switched discharge circuit to discharge the second output.

37 Claims, 6 Drawing Sheets

(56) References Cited

U.S. PATENT DOCUMENTS

| | | | |
|---|---|---|---|
| 2013/0127522 A1* | 5/2013 | Mohan | H02M 3/07 327/536 |
| 2015/0263610 A1* | 9/2015 | Ferrant | H02M 3/07 327/536 |
| 2020/0161966 A1 | 5/2020 | de Santis et al. | |
| 2020/0195134 A1 | 6/2020 | Piccardi et al. | |

* cited by examiner

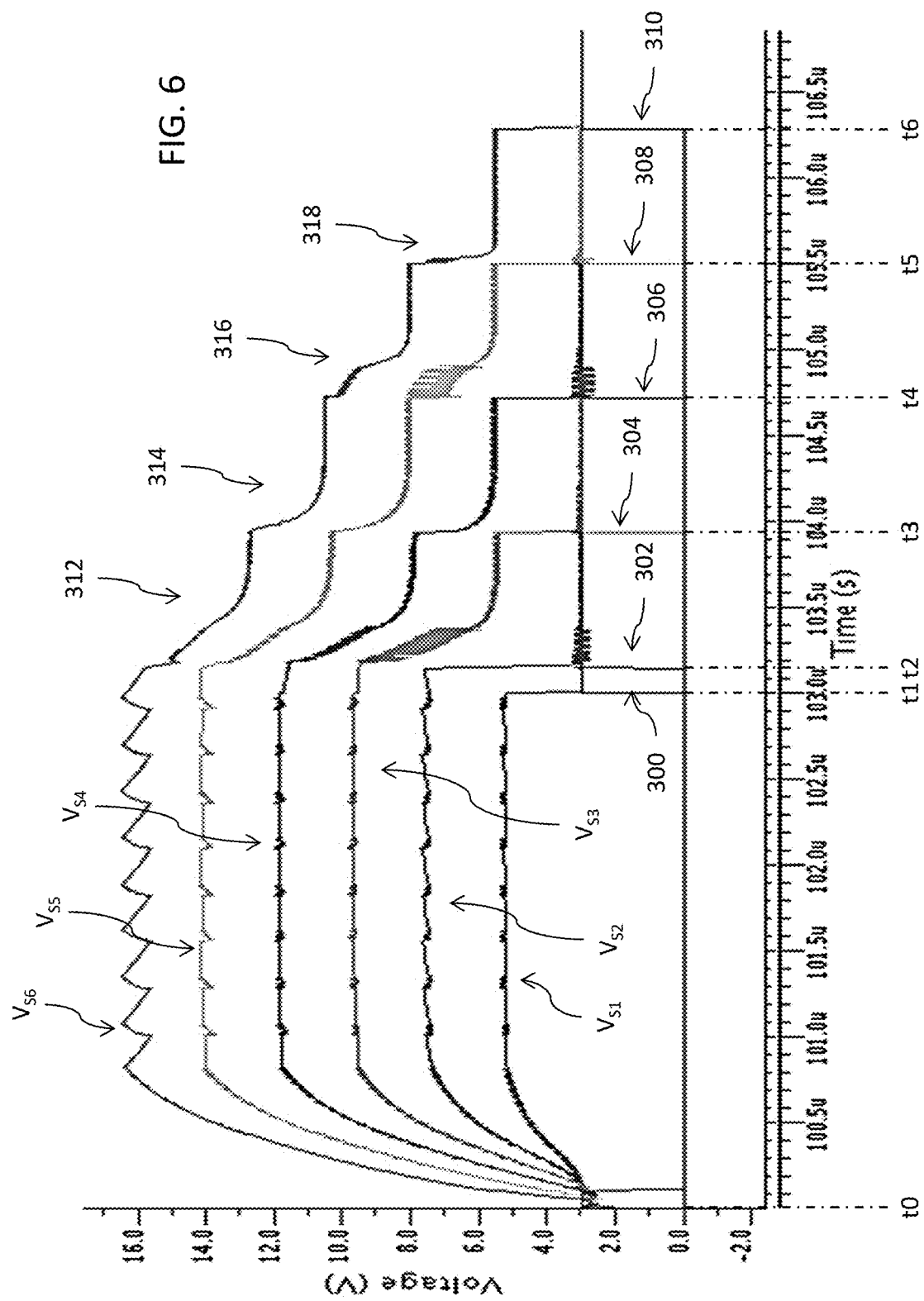

CIRCUIT AND METHOD FOR CONTROLLED DISCHARGE OF A HIGH (POSITIVE OR NEGATIVE) VOLTAGE CHARGE PUMP

CROSS-REFERENCE TO RELATED APPLICATIONS

This application claims priority from U.S. Provisional Application for Patent No. 63/115,725, filed Nov. 19, 2020, the disclosure of which is incorporated by reference.

TECHNICAL FIELD

The present invention generally relates to a circuit for controlled discharge of a multi-stage high (positive or negative) voltage charge pump.

BACKGROUND

Many circuits require supply voltages that are relatively high (for example, at or in excess of 12 V). A non-volatile memory is an example of such a circuit. The program and erase operations in such memories are performed using the Fowler-Nordeim tunneling effect which requires the use of such high voltages. It is common for these high voltages to be generated on-chip from a relatively lower supply voltage (for example, 3 V, 3.3 V or 5 V) using a high voltage charge pump circuit.

A typical multi-stage high (positive) voltage charge pump circuit 10 is shown in FIG. 1. The charge pump circuit 10 includes N pump stage circuits 12(1) to 12(N) that are connected in series. Each pump stage circuit 12 includes an input configured to receive a first voltage and an output configured to generate a second voltage that is higher than the first voltage. In the series connection of the pump stage circuits 12, the output of the first pump stage circuit 12(1) is connected to the input of the second pump stage circuit 12(2), the output of the second pump stage circuit 12(2) is connected to the input of the third pump stage circuit 12(3), and so on, up to where the input of the Nth pump stage circuit 12(N) is connected to the output of the (N−1)th pump stage circuit 12(N−1).

The internal circuitry for each pump stage circuit 12 is well known to those skilled in the art and is not illustrated in the figures and will not be described in detail herein. As an example, however, each pump stage circuit 12 may exploit clocked charge transfer between capacitors that are used as charge accumulation elements. In such a pump stage circuit, clock signals CLK and CLKb of opposite phase are used to control switches (for example, MOSFET devices) to selectively transfer charge to and between capacitors.

The overall charge pump circuit 10 has an input 14 configured to receive an input voltage Vin that is applied to the input of the first pump stage circuit 12(1) and further has an output 16 configured to generate an output voltage Vout at the output of the Nth pump stage circuit 12(2). The output 16 is coupled to a load (not shown) and the output voltage Vout has a suitably boosted voltage level with respect to the input voltage Vin. As an example, with an input voltage of Vin=3 V and where each pump stage circuit 12 may provide a voltage boost of about 2.2 V, an N=6 charge pump circuit 10 will generate an output voltage Vout that is approximately equal to (N+1)*Vin (in this case, for example, Vout=16 V).

The charge pump circuit 10 includes a clock generator circuit 20 that is configured to generate a set of complementary clock signals CLK and CLKb that are applied to each pump stage circuit 12 to control the clocked charge transfer operations. In alternate embodiments the clock signals used to drive each pump stage circuit may include more than two phases—for example, a four-phase set of clock signals is used by certain known pump stage circuits. Operation of the clock generator circuit 20 is enabled in response to an enable signal En that is generated by a comparator circuit 22. An output voltage detection circuit 26 is coupled between the output 16 and ground and is configured to sense the output voltage Vout and generate a feedback voltage Vfb that is indicative of (i.e., is a fraction of) the output voltage Vout. The output voltage detection circuit 26 may, for example, comprise a resistive voltage divider circuit including at least two resistors R1, R2 and a tap node T. The comparator circuit 22 operates to compare the feedback voltage Vfb to a reference voltage Vref and generate the enable signal En to turn on the clock generator circuit 20 when Vfb<Vref and, conversely, turn off the clock generator circuit 20 when Vref<Vfb. The reference voltage Vref may, for example, be generated by a bandgap circuit.

When the charge pump circuit 10 is subsequently turned off, it is important to properly discharge the output of each pump stage circuit 12 to a suitable low voltage level. More specifically, this discharge operation refers to the discharging of the high voltage storing capacitors within the pump stage circuits 12. If the capacitor discharge operation is not properly performed, a number of potential problems can arise, including: ground-bounce (due to discharge to the ground node), supply noise generation (due to discharge to the supply node), latch-up (if high uncontrolled current is dumped into the ground/supply node and the localized bulk is forward biased), snap-back (if high uncontrolled current is dumped into the ground/supply node and a parasitic bipolar junction transistor is triggered) or device reliability concerns (for example due to violation of safe operating area (SOA) limits in response to the uncontrolled current leading to junction break-down, oxide related issues or aging issues).

There is accordingly a need in the art for a controlled discharge of the pump stage circuits within a multi-stage high voltage charge pump circuit.

Reference is further made to United States Patent Application Publication Nos. 2020/0195134 and 2020/0161966 (incorporated herein by reference) which teach examples of charge pump discharge circuits.

SUMMARY

In an embodiment, a circuit comprises: a charge pump circuit including a plurality of charge pump stage circuits coupled in series; and a discharge circuit configured to discharge the charge pump circuit; wherein the discharge circuit comprises: a plurality of switched discharge circuits, where each switched discharge circuit is coupled to an output of a corresponding one of the charge pump stage circuits and configured, when actuated, to discharge said output; and a discharge control circuit configured to sequentially actuate each switched discharge circuit of the plurality of switched discharge circuits over a discharge time period.

In an embodiment, a circuit comprises: a charge pump circuit including a first charge pump stage circuit coupled in series with a second charge pump stage circuit; and a discharge circuit configured to discharge the charge pump circuit; wherein the discharge circuit comprises: a first switched discharge circuit coupled to a first output of the first charge pump stage circuit and configured, when actuated, to discharge said first output; a second switched discharge circuit coupled to a second output of the second charge pump stage circuit and configured, when actuated, to discharge said second output; and a discharge control circuit configured to actuate the first switched discharge circuit to discharge said first output and then, after said first output is fully discharged to a certain voltage level, actuate the second switched discharge circuit to discharge said second output to said certain voltage level.

BRIEF DESCRIPTION OF THE DRAWINGS

For a better understanding of the embodiments, reference will now be made by way of example only to the accompanying figures in which:

FIG. 6 shows waveform traces for a simulated operation of the charge pump circuit with the discharge circuit as shown in FIG. 2A.

DETAILED DESCRIPTION

Figure 2A:
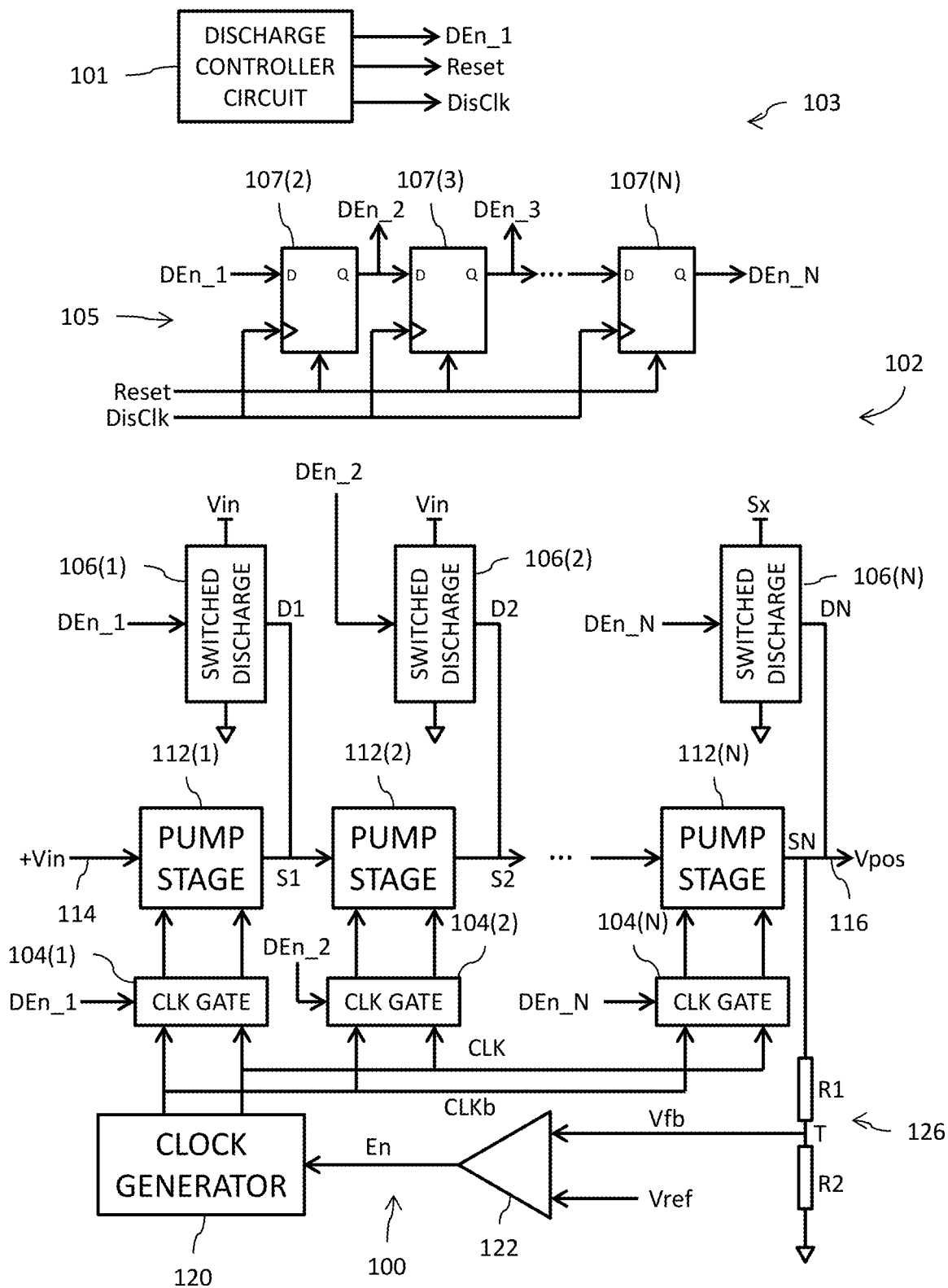
FIGS. 2A-2B show block diagrams of a positive and negative, respectively, multi-stage high voltage charge pump circuit with a discharge circuit.
Figure 3:
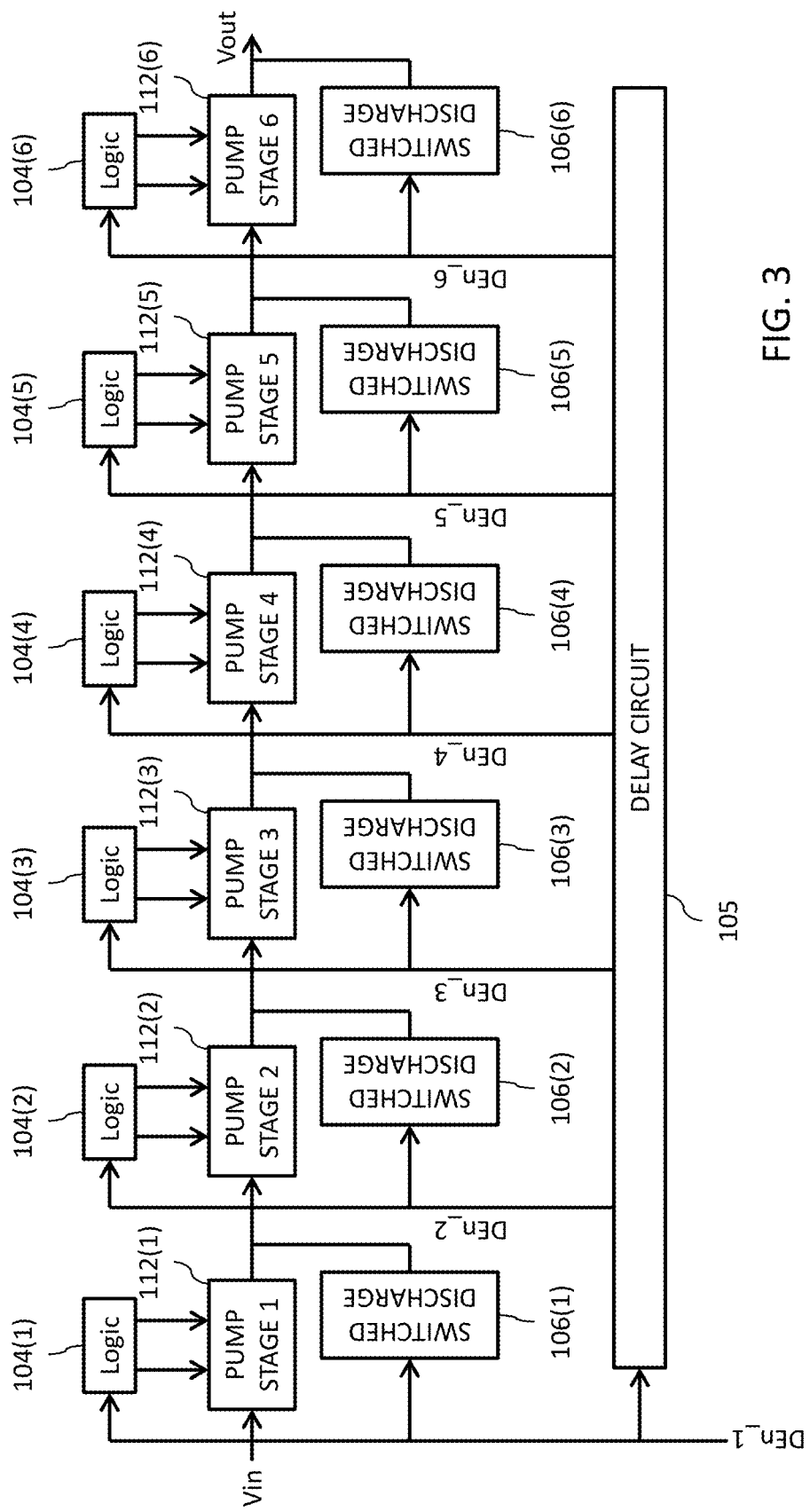
FIG. 3 shows more generalized block diagram of the circuits in FIGS. 2A-2B.

Reference is now made to FIG. 2A which shows a block diagram of a positive multi-stage high voltage charge pump circuit 100 with a discharge circuit 102. An illustration of the circuit of FIG. 2A implemented as a six stage charge pump is provided by FIG. 3. The charge pump circuit 100 includes N pump stage circuits 112(1) to 112(N) that are connected in series. Each pump stage circuit 112 includes an input configured to receive a first voltage and an output (Sx, where x=1 to N) configured to generate a second voltage that is higher than the first voltage. In the series connection of the pump stage circuits 112, the output S1 of the first pump stage circuit 112(1) is connected to the input of the second pump stage circuit 112(2), the output S2 of the second pump stage circuit 112(2) is connected to the input of the third pump stage circuit 112(3), and so on, up to where the input of the Nth pump stage circuit 112(N) is connected to the output SN−1 of the (N−1)th pump stage circuit 112(N−1).

The internal circuitry for each pump stage circuit 112 is well known to those skilled in the art and is not illustrated in the figures and will not be described in detail herein. As an example, however, each pump stage circuit 112 may exploit clocked charge transfer between capacitors that are used as charge accumulation elements. In such a pump stage circuit, clock signals CLK and CLKb of opposite phase are used to control switches (for example, MOSFET devices) to selectively transfer charge to and between capacitors. It will be understood that in an alternate embodiment, each pump stage circuit may be driven by a set of clock signals including more than two phases—for example, a four phase set of clock signals.

The overall charge pump circuit 100 in FIG. 2A is a positive voltage generator circuit having an input 114 configured to receive an input positive voltage Vin=+Vin that is applied to the input of the first pump stage circuit 112(1) and further has a output 116 configured to generate a boosted positive output voltage Vpos at the output SN of the Nth pump stage circuit 112(N). The output 116 is coupled to a load (not shown) and the output voltage Vpos has a suitably boosted voltage level with respect to the input voltage +Vin. As an example, each pump stage circuit 112 may provide a voltage boost of about 2.2 V, and thus an N=6 charge pump circuit 100 with an input voltage +Vin=3V will generate an output voltage Vpos=$V_{S6}$ that is approximately equal to 16 V, where $V_{S1}$=5.2 V, $V_{S2}$=7.4 V, $V_{S3}$=9.6 V, $V_{S4}$=11.8 V, and $V_{S5}$=14 V (see, FIG. 6).

Figure 2B:
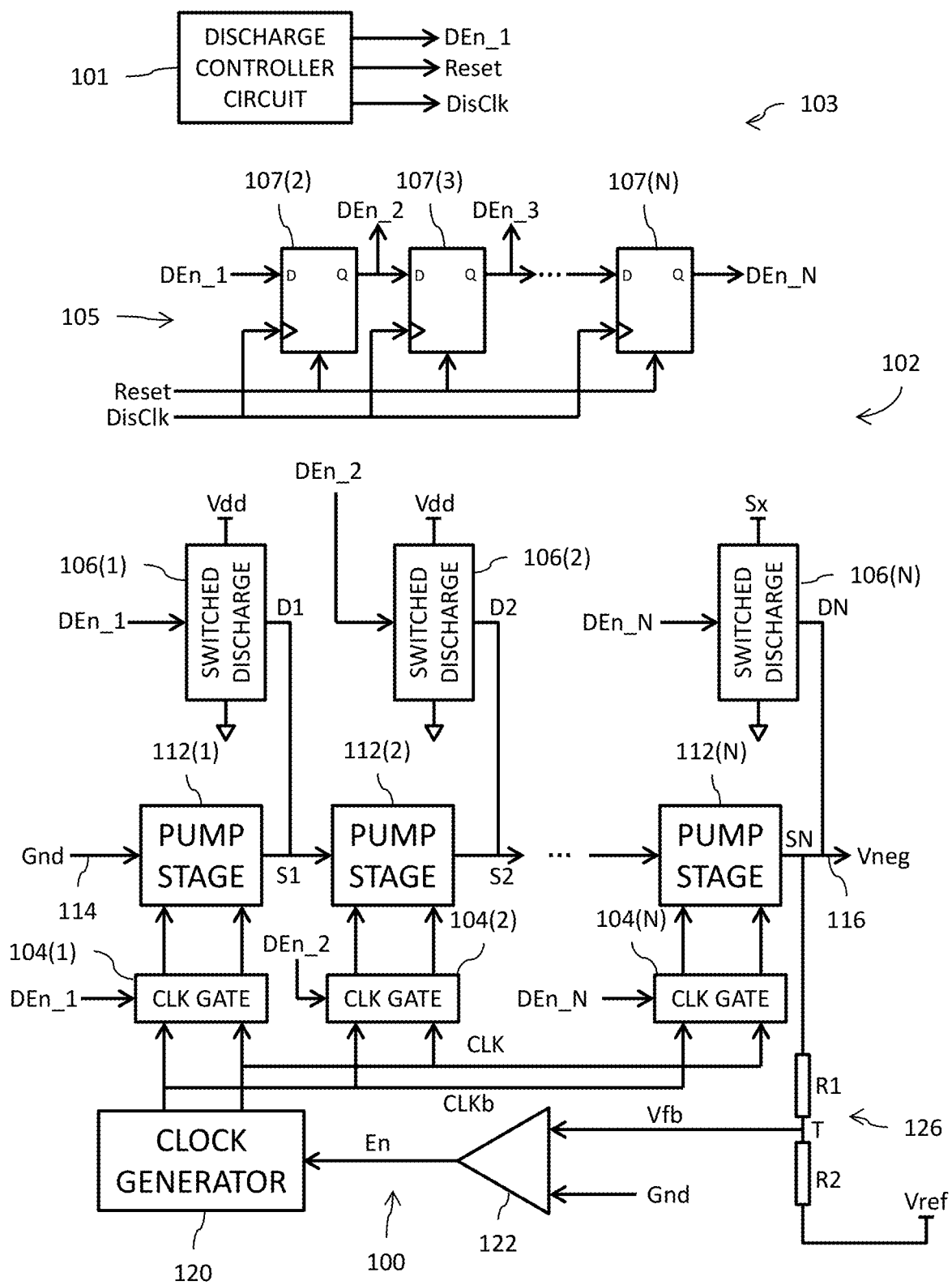

In an alternative implementation as shown in FIG. 2B, the overall charge pump circuit 100 is a negative voltage generator circuit input 114 configured to receive an input ground voltage Vin=Gnd that is applied to the input of the first pump stage circuit 112(1) and generate a boosted negative output voltage Vneg at the output SN, 116 of the Nth pump stage circuit 112(N). As an example, each pump stage circuit 112 may provide a voltage boost of about 2.2 V, and thus an N=6 charge pump circuit 100 with an input voltage at ground and a circuit supply voltage Vdd=3V will generate an output voltage Vneg=$V_{S6}$ that is approximately equal to −13 V, where $V_{S1}$=−2.2 V, $V_{S2}$=−4.4 V, $V_{S3}$=−6.6 V, $V_{S4}$=−8.8 V, and $V_{S5}$=−11.0 V The charge pump circuit 100 includes a clock generator circuit 120 that is configured to generate complementary clock signals CLK and CLKb (again, note a possible embodiment with more than two—such as four—phases for the clock signals). Each one of the N clock gating (logic) circuits 104(1) to 104(N) is coupled to receive the complementary clock signals CLK and CLKb. Each clock gating circuit 104 further receives a corresponding one of N discharge control signals DEn_1 to DEn_N that controls the gating operation for selectively passing the complementary clock signals CLK and CLKb to a corresponding pump stage circuit 112. When the control signal DEn is deasserted, the complementary clock signals CLK and CLKb are passed by the clock gating circuit 104. Conversely, when the control signal DEn is asserted, a blocking operation is performed and the complementary clock signals CLK and CLKb are not passed.

Operation of the clock generator circuit 120 is enabled in response to an enable signal En that is generated by a comparator circuit 122. An output voltage detection circuit 126 is coupled between the output 116 and ground and is configured to sense the output voltage Vout and generate a feedback voltage Vfb that is indicative of (i.e., is a fraction of) the output voltage Vout. The output voltage detection circuit 126 may, for example, comprise a resistive voltage divider circuit including at least two resistors R1, R2 and a tap node T. In the embodiment of FIG. 2A, the comparator circuit 122 operates to compare the feedback voltage Vfb to a reference voltage Vref and generate the enable signal En to turn on the clock generator circuit 120 when Vfb<Vref and, conversely, turn off the clock generator circuit 120 when Vref<Vfb. In the embodiment of FIG. 2B, because the voltage boosting operation is negative, the resistive voltage divider circuit of the output voltage detection circuit 126 is coupled between the output node and the reference voltage Vref and the comparator circuit 122 operates to compare the feedback voltage Vfb to the ground voltage Gnd. The enable signal En turns on the clock generator circuit 120 when Gnd<Vfb and, conversely, turn off the clock generator circuit 120 when Vfb<Gnd. The reference voltage Vref may, for example, be generated by a bandgap circuit.

When the charge pump circuit 100 is subsequently turned off, it is important to properly discharge the output of each pump stage circuit 112 to a suitable low voltage level (for example, to the voltage level of the input voltage Vin). More specifically, this discharge operation refers to the discharging of the high voltage storing capacitors within the pump stage circuits 112. The discharge circuit 102 is coupled to the charge pump circuit 100 and configured for operation to discharge the voltage at the output Sx of each pump stage circuit 112 in a controlled manner.

N switched discharge circuits 106(1) to 106(N) are coupled to the charge pump circuit 100 and selectively controlled to discharge and clamp the output of each pump stage circuit 112 to a certain voltage level (for example, Vin). Each switched discharge circuit 106 is connected for power supply to the input voltage Vin (or the voltage at one of the outputs Sx, or the voltage Vdd) and ground. A control input of each switched discharge circuit 106 is coupled to receive a corresponding one of the N control signals DEn_1 to DEn_N. An output Dx of each switched discharge circuits 106 is coupled to a corresponding output Sx of the charge pump stage circuit 112. The control signals DEn_1 to DEn_N control the discharge and clamp operation performed by a switched discharge circuit 106 on the output of a corresponding pump stage circuit 112. When the control signal DEn is deasserted, the switched discharge circuit 106 is disabled and the output Dx of that switched discharge circuit 106 is tristated. Conversely, when the control signal DEn is asserted (which occurs, as noted above, when the complementary clock signals CLK and CLKb are not passed by the clock gating circuit 104), the switched discharge circuit 106 is enabled for performing the discharge and clamp operation at the output Dx of the switched discharge circuit 106. In particular, the enabled switched discharge circuit 106 will clamp the output Sx of the pump stage circuit 112 to the voltage level of the at the supply node (either the input voltage Vin or the voltage at certain node Sx).

A discharge control circuit 103 operates to control the discharge and clamp operation for the discharge circuit 102. The discharge control circuit 103 includes a controller circuit 101 that generates the first control signal DEn_1 that is applied to the corresponding first clock gating circuit 104(1) and the first switched discharge circuit 106(1). The discharge control circuit 103 further includes a delay circuit 105 that generates the second through Nth control signals DEn_2 to DEn_N. The first control signal DEn_1 is applied to the input of the delay circuit 105. The second control signal DEn_2 is applied to the corresponding second clock gating circuit 104(2) and the second switched discharge circuit 106(2), . . . , and the Nth control signal DEn_N is applied to the corresponding Nth clock gating circuit 104(N) and the Nth switched discharge circuit 106(N).

The delay circuit 105 includes N-1 flip flop circuits 107(2) to 107(N) that are coupled in series with each other. The data input of the first flip flop circuit 107(2) receives the first control signal DEn_1. In the series connection of the flip flop circuits 107, the output of the first flip flop circuit 107(2), providing the second control signal DEn_2, is connected to the input of the second flip flop circuit 107(3), the output of the second flip flop circuit 107(3), providing the third control signal DEn_3, is connected to the input of the third flip flop circuits 107(4), and so on, up to where the input of the Nth flip flop circuit 107(N) is connected to the output of the (N-1)th flip flop circuit 107(N-1), and the output of the Nth flip flop circuit 107(N) provides the Nth control signal DEn_N.

It will be understood that the illustrated circuitry for the delay circuit 105 is just an example. In an alternative configuration, the delay circuit 105 may instead be formed by a resistor-capacitor (RC) circuitry with logic gates that provide the control signals DEn with the necessary delayed timing relationship.

The reset inputs of the N-1 flip flop circuits 107(2) to 107(N) all receive a reset signal (Reset) that is generated by the discharge controller circuit 101. In response to an assertion of the Reset signal, the output of each flip flop circuit 107 is placed in the reset logic state and the corresponding control signals DEn will all be deasserted. In other words, when the discharge controller circuit 101 asserts the Reset signal, this action, along with the simultaneous deassertion of the first control signal DEn_1, will disable all of the N switched discharge circuits 106(1) to 106(N). Additionally, because all of the control signals DEn are deasserted, the N clock gating circuits 104(1) to 104(N) are enabled and will pass the complementary clock signals CLK and CLKb to the corresponding pump stage circuits 112(1) to 112(N). In this situation, normal operation of the charge pump circuit 100 to boost the input voltage Vin and generate the output voltage Vout is supported.

Figure 1:
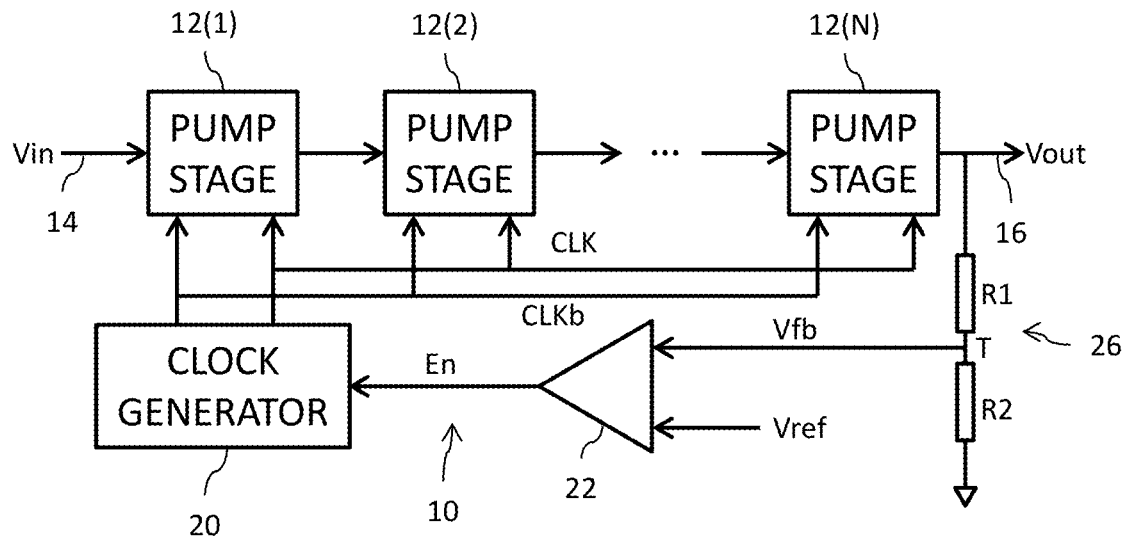
FIG. 1 shows a block diagram of a typical multi-stage high voltage charge pump circuit.
Figure 4:
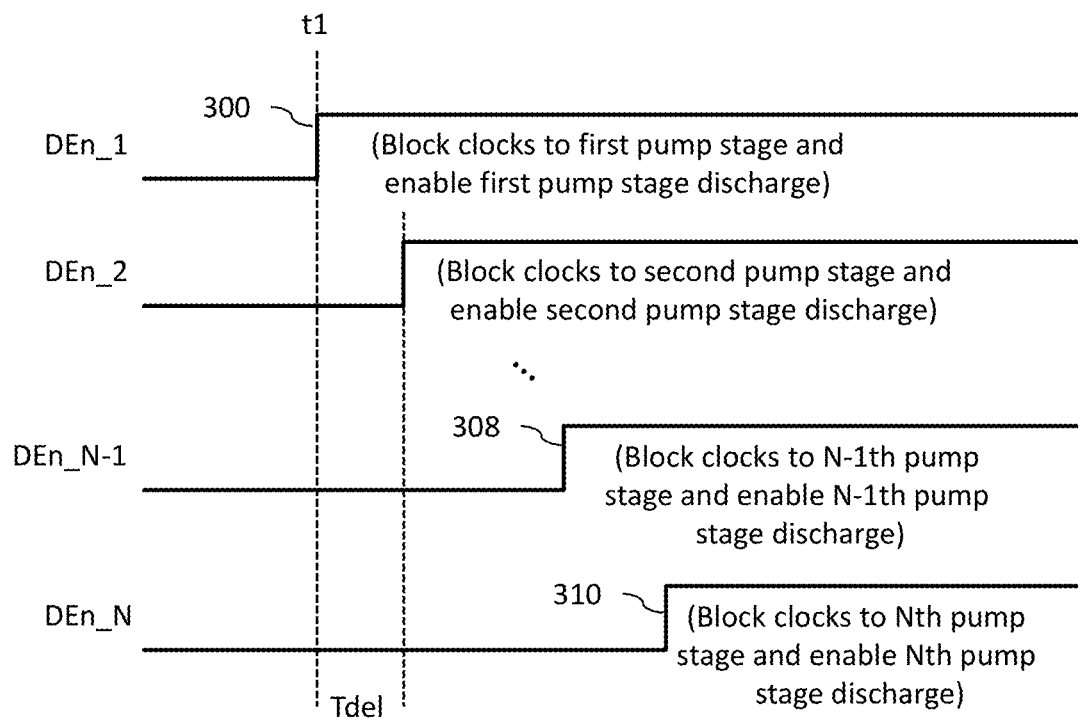
FIG. 4 is a timing diagram.

The clock inputs of the N-1 flip flop circuits 107(2) to 107(N) all receive a discharge clock signal DisClk that is generated by the discharge controller circuit 101. In response to a deassertion of the Reset signal, along with the simultaneous assertion of the first control signal DEn_1, there will be a series of sequential assertions of the remaining control signals DEn_2 to DEn_N in response to each cycle (with a period of Tdel) of the discharge clock signal DisClk (see, FIG. 4) due to operation of the delay circuit 105. Each assertion of a control signal DEn will cause the corresponding clock gating circuit 104 to block passage of the complementary clock signals CLK and CLKb to the corresponding pump stage circuit 112, and further cause the corresponding switched discharge circuit 106 to be enabled so as to discharge and clamp the output of that corresponding pump stage circuit 112.

The frequency of the discharge clock signal DisClk is selected so that the period Tdel is sufficiently long to ensure that discharging and clamping operation at the output of each charge pump stage circuit 112, regardless of the level of the boosted voltage at the output, is completed.

Figure 5A:
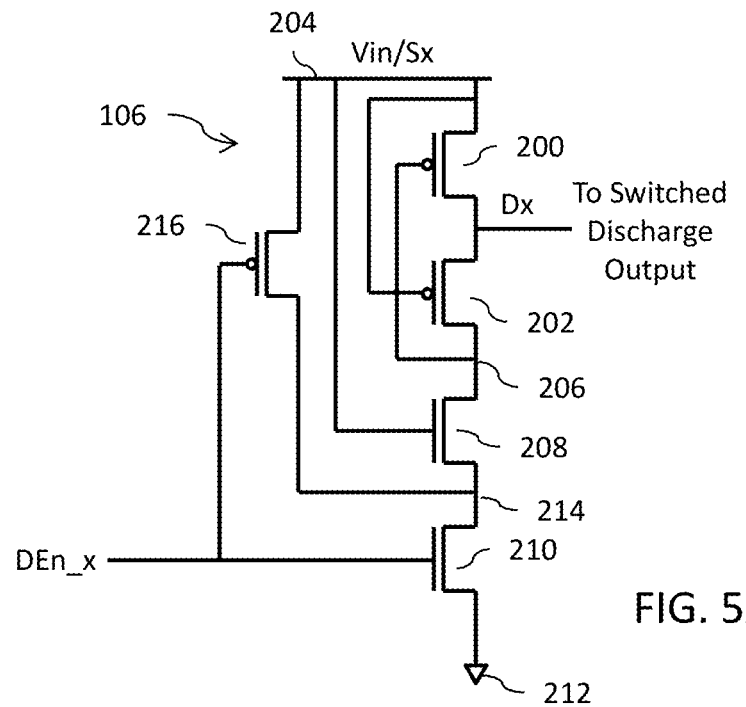
FIGS. 5A and 5B show circuit diagrams for a switched discharge circuit.

Reference is now made to FIG. 5A which shows a circuit diagram for an embodiment of the switched discharge circuit 106. A first p-channel MOSFET device 200 and second p-channel MOSFET device 202 have their source-drain paths connected in series with each other between a positive supply node 204 and a first intermediate node 206. The sources of the transistors 200 and 202 are connected to each other at the output node Dx. The gate of transistor 200 is coupled to the first intermediate node 206 and the gate of transistor 202 is coupled to the positive supply node 204. The switched discharge circuit 106 further includes a first n-channel MOSFET device 208 and second n-channel MOSFET device 210 having their source-drain paths connected in series with each other between the first intermediate node 206 and a ground supply node 212. The source of transistor 208 and the drain of transistor 210 are connected to each other at second intermediate node 214. The gate of transistor 208 is coupled to the positive supply node 204. The gate of transistor 210 is coupled to receive the control signal DEn_x. The switched discharge circuit 106 still further includes a third p-channel MOSFET device 216 having a source coupled to the positive supply node 204, a drain coupled to the second intermediate node 214, and a gate coupled to receive the control signal DEn_x.

In response to deassertion (at ground voltage, for example) of the control signal DEn_x, transistors 200, 208 and 210 are turned off and transistors 202 and 216 are turned on. The output node Dx is placed in a tristate condition. Conversely, in response to assertion (at voltage Vin, for example) of the control signal DEn_x, transistors 200, 208 and 210 are turned on and transistors 202 and 216 are turned off. In this condition, the voltage at output node Dx is discharged and then clamped to the voltage at the positive supply node 204.

In a multi-stage charge pump circuit 100 where N>2, the positive supply node 204 of the first two switched discharge circuits 106(1) and 106(2) is coupled to receive the input voltage Vin. The remaining switched discharge circuits 106, however, have their positive supply nodes 204 coupled to receive the voltages at selected one(s) of the outputs Sx for the charge pump stage circuits 112. As an example, where N=4, the positive supply nodes 204 of the third and fourth switched discharge circuits 106(1) and 106(2) are coupled to receive the voltage at the output S1 of the first charge pump stage circuit 112(1).

As a further example, where N=5, the positive supply node 204 of the fifth switched discharge circuit 106(5) is coupled to receive the voltage at the output S2 of the second charge pump stage circuit 112(2).

Still further, where N=6, the positive supply node 204 of the sixth switched discharge circuit 106(6) is coupled to receive the voltage at the output S4 of the fourth charge pump stage circuit 112(4).

This connection for the positive supply nodes 204 of higher-order switched discharge circuits 106 to the output Sx is necessary because when the switched discharge circuit 106 is disabled the voltage at the node Dx will be pumped high and the presence of this voltage will stress the p-channel transistor 200. By connecting the source of transistor 200 at the positive supply nodes 204 to receive the voltage at the output Sx the undesirable stress on the transistor 200 is avoided.

Figure 5B:
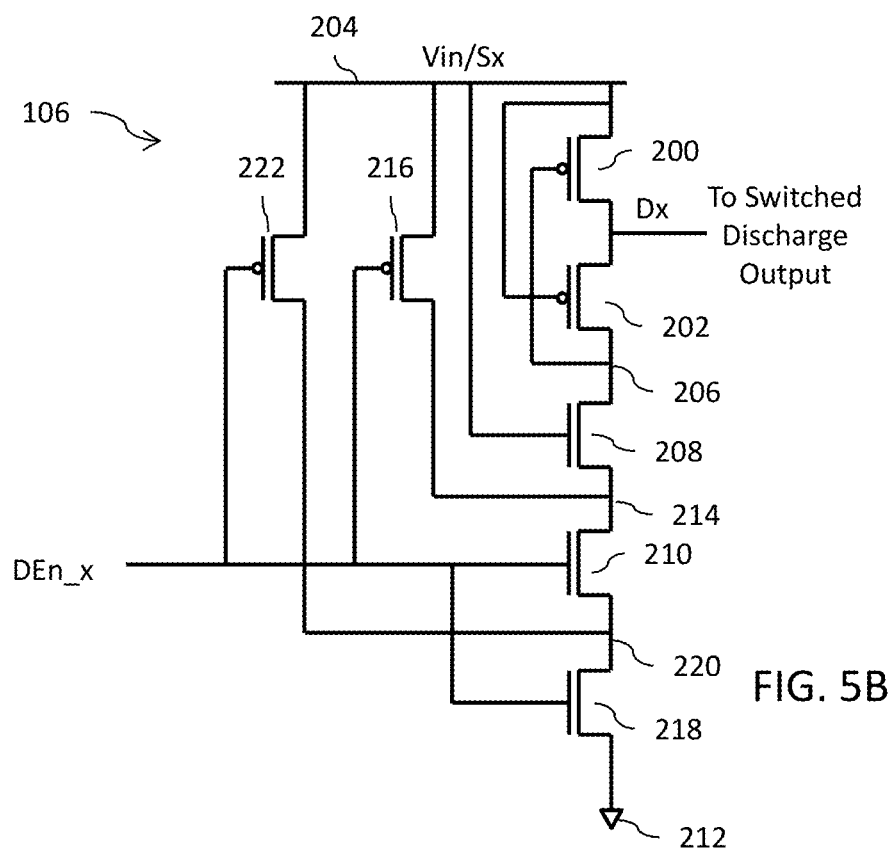

In addition, due to the potential need of the switched discharge circuit 106 to handle higher voltage, the circuit 106 as shown in FIG. 5A is modified to provide an embodiment for higher voltage operation as shown in FIG. 5B. A first p-channel MOSFET device 200 and second p-channel MOSFET device 202 have their source-drain paths connected in series with each other between a positive supply node 204 and a first intermediate node 206. The sources of the transistors 200 and 202 are connected to each other at the output node Dx. The gate of transistor 200 is coupled to the first intermediate node 206 and the gate of transistor 202 is coupled to the positive supply node 204. The switched discharge circuit 106 further includes a first n-channel MOSFET device 208, second n-channel MOSFET device 210 and third n-channel MOSFET device 218 having their source-drain paths connected in series with each other between the first intermediate node 206 and a ground supply node 212. The source of transistor 208 and the drain of transistor 210 are connected to each other at second intermediate node 214, and the source of transistor 210 and the drain of transistor 218 are connected to each other at third intermediate node 220. The gate of transistor 208 is coupled to the positive supply node 204. The gates of transistors 210 and 218 are coupled to receive the control signal DEn_x. The switched discharge circuit 106 still further includes a third p-channel MOSFET device 216 having a source coupled to the positive supply node 204, a drain coupled to the second intermediate node 214, and a gate coupled to receive the control signal DEn_x. Additionally, a fourth p-channel MOSFET device 222 has a source coupled to the positive supply node 204, a drain coupled to the third intermediate node 220, and a gate coupled to receive the control signal DEn_x.

Operation of the FIG. 5B circuit is similar to that of the FIG. 5A circuit.

Reference is now made to FIG. 6 which shows waveform traces for a simulated operation of the charge pump circuit 100 with discharge circuit 102 as shown in FIG. 2. In this instance, N=6. The time period prior to time t0 shows standby operation of the charge pump circuit 100. The time period between time t0 and t1 shows normal operation of the charge pump circuit 100. For this example where each pump stage circuit 112 provides a voltage boost of about 2.2 V and, the voltage levels at the outputs the charge pump stage circuits 112 are: $V_{S1}$=5.2 V, $V_{S2}$=7.4 V, $V_{S3}$=9.6 V, $V_{S4}$=11.8 V, $V_{S5}$=14 V and $V_{S6}$=Vout=16 V. During this normal operation time period, the discharge circuit 102 is disabled.

A time t1, the discharge circuit 102 is enabled and the discharge control circuit 103 begins the discharge and clamp operation. The discharge controller circuit 101 asserts the first control signal DEn_1 (reference 300, see also FIG. 4) that is applied to the corresponding first clock gating circuit 104(1) and the first switched discharge circuit 106(1). The pumping operation of the first charge pump stage circuit 112(1) is disabled because the clock is blocked by the first clock gating circuit 104(1). The first switched discharge circuit 106(1) is enabled for operation and the voltage at the output of the first charge pump stage circuit 112(1) is discharged and clamped to equal the input voltage Vin=3 V.

At the next leading edge of the discharge clock signal DisClk, which occurs at time t2, the second control signal DEn_2 (reference 302) is asserted and applied to the corresponding second clock gating circuit 104(2) and the second switched discharge circuit 106(2). The pumping operation of the second charge pump stage circuit 112(2) is disabled because the clock is blocked by the second clock gating circuit 104(2). The second switched discharge circuit 106(2) is enabled and the voltage at the output of the second charge pump stage circuit 112(2) is discharged and clamped to equal the input voltage Vin=3 V. Because the voltage at the output of the second charge pump stage circuit 112(2) is the input voltage for the remaining series-coupled charge pump stage circuits 112, and because each of these charge pump stage circuits 112 continue to receive their complementary clock signals, it will be noted that the output voltages for the remaining charge pump stage circuits 112 will all fall (reference 312) to a degree that is dependent on the input voltage at the third charge pump stage circuit 112(3).

At the next leading edge of the discharge clock signal DisClk, which occurs at time t3, the third control signal DEn_3 (reference 304) is asserted and applied to the corresponding third clock gating circuit 104(3) and the third switched discharge circuit 106(3). The pumping operation of the third charge pump stage circuit 112(3) is disabled because the clock is blocked by the third clock gating circuit 104(3). The third switched discharge circuit 106(3) is enabled and the voltage at the output of the third charge pump stage circuit 112(3) is discharged and clamped to equal the input voltage Vin=3 V. Because the voltage at the output of the third charge pump stage circuit 112(3) is the input voltage for the remaining series-coupled charge pump stage circuits 112, and because each of these charge pump stage circuits 112 continue to receive their complementary clock signals, it will be noted that the output voltages for the remaining charge pump stage circuits 112 will all fall (reference 314) to a degree that is dependent on the input voltage at the fourth charge pump stage circuit 112(4).

At the next leading edge of the discharge clock signal DisClk, which occurs at time t4, the fourth control signal DEn_4 (reference 306) is asserted and applied to the corresponding fourth clock gating circuit 104(4) and the fourth switched discharge circuit 106(4). The pumping operation of the fourth charge pump stage circuit 112(4) is disabled because the clock is blocked by the fourth clock gating circuit 104(4). The fourth switched discharge circuit 106(4) is enabled and the voltage at the output of the fourth charge pump stage circuit 112(4) is discharged and clamped to equal the input voltage Vin=3 V. Because the voltage at the output of the fourth charge pump stage circuit 112(4) is the input voltage for the remaining series-coupled charge pump stage circuits 112, and because each of these charge pump stage circuits 112 continue to receive their complementary clock signals, it will be noted that the output voltages for the remaining charge pump stage circuits 112 will all fall (reference 316) to a degree that is dependent on the input voltage at the fifth charge pump stage circuit 112(5).

At the next leading edge of the discharge clock signal DisClk, which occurs at time t5, the fifth control signal DEn_5 (reference 308, see also FIG. 4) is asserted and applied to the corresponding fifth clock gating circuit 104(5) and the fifth switched discharge circuit 106(5). The pumping operation of the fifth charge pump stage circuit 112(5) is disabled because the clock is blocked by the fifth clock gating circuit 104(1). The fifth switched discharge circuit 106(5) is enabled and the voltage at the output of the fifth charge pump stage circuit 112(5) is discharged and clamped to equal the input voltage Vin=3 V. Because the voltage at the output of the fifth charge pump stage circuit 112(5) is the input voltage for the sixth charge pump stage circuit 112(6), and because this charge pump stage circuit 112 continues to receive the complementary clock signals, it will be noted that the output voltage for the sixth charge pump stage circuit 112 falls (reference 318) to a degree that is dependent on the input voltage at the sixth charge pump stage circuit 112(6).

At the next leading edge of the discharge clock signal DisClk, which occurs at time t6, the sixth control signal DEn_6 (reference 310, see also FIG. 4) is asserted and applied to the corresponding sixth clock gating circuit 104(6) and the sixth switched discharge circuit 106(6). The pumping operation of the sixth charge pump stage circuit 112(6) is disabled because the clock is blocked by the sixth clock gating circuit 104(6). The sixth switched discharge circuit 106(6) is enabled and the voltage at the output of the sixth charge pump stage circuit 112(6) is discharged and clamped to equal the input voltage Vin=3 V. At this point, a complete discharge of the charge pump circuit 100 has been accomplished with the output voltages at all charge pump stage circuits 112 clamped to the level of the input voltage Vin.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit, comprising:
    a charge pump circuit including a plurality of charge pump stage circuits coupled in series, wherein each charge pump stage circuit is controlled by a clock signal; and
    a discharge circuit configured to discharge the charge pump circuit;
    wherein the discharge circuit comprises:
        a plurality of switched discharge circuits, where each switched discharge circuit is coupled to an output of a corresponding one of the charge pump stage circuits and configured, when actuated, to discharge said output; and
        a discharge control circuit configured to sequentially actuate each switched discharge circuit of the plurality of switched discharge circuits over a discharge time period and to block the clock signal for said corresponding one of the charge pump stage circuits simultaneously with actuation of the switched discharge circuit for the same said corresponding one of the charge pump stage circuits.

2. The circuit of claim 1, wherein sequential actuation of each switched discharge circuit the switched discharge circuits controlled by a discharge clock signal.

3. The circuit of claim 2, wherein the discharge clock signal has a period of sufficient length to ensure that the output of a given one of the charge pump stage circuits is fully discharged to a certain voltage level before a subsequent one of the charge pump stage circuits is discharged by the sequential actuation of the switched discharge circuits.

4. The circuit of claim 1, wherein the discharge control circuit controls sequential actuation of the switched discharge circuits over the discharge time period such that the output of a given one of the charge pump stage circuits is fully discharged to a certain voltage level before a subsequent one of the charge pump stage circuits is discharged.

5. The circuit of claim 1, wherein the charge pump circuit is a positive voltage charge pump.

6. The circuit of claim 1, wherein the charge pump circuit is a negative voltage charge pump.

7. A circuit, comprising:
    a charge pump circuit including a first charge pump stage circuit coupled in series with a second charge pump stage circuit; and
    a discharge circuit configured to discharge the charge pump circuit;
    wherein the discharge circuit comprises:
        a first switched discharge circuit coupled to a first output of the first charge pump stage circuit and configured, when actuated, to discharge said first output;
        a second switched discharge circuit coupled to a second output of the second charge pump stage circuit and configured, when actuated, to discharge said second output; and
        a discharge control circuit configured to actuate the first switched discharge circuit to discharge said first output and then, after said first output is fully discharged to a certain voltage level, actuate the second switched discharge circuit to discharge said second output to said certain voltage level;
    wherein the discharge circuit further comprises:
        a first clock gating circuit configured to selectively pass a charge pump clock signal to the first charge pump stage circuit;
        a second clock gating circuit configured to selectively pass said charge pump clock signal to the second charge pump stage circuit; and
        wherein the discharge control circuit is further configured to control the first clock gate circuit to block the charge pump clock signal when actuating the first switched discharge circuit, and control the second clock gate circuit to block the charge pump clock signal when actuating the second switched discharge circuit.

8. The circuit of claim 7, wherein a length of time between actuation of the first switched discharge circuit and actuation of the second switched discharge circuit is controlled by a period of a discharge clock signal.

9. The circuit of claim 7, further comprising:
a clock generator circuit configured to generate said charge pump clock signal;
a sensing circuit configured to sense a voltage at the output of a last charge pump stage circuit and generate a feedback voltage from said sensed voltage;
wherein said clock generator circuit is enabled for operation when said feedback voltage is less than a reference voltage.

10. The circuit of claim 9, wherein the reference voltage is a bandgap voltage.

11. The circuit of claim 7, wherein each of the first and second switched discharge circuits comprises:
a first supply node;
a second supply node;
a plurality of transistors having source-drain paths coupled in series between the first and second supply nodes, wherein said plurality of transistors comprises:
a first p-channel transistor and second p-channel transistor coupled in series between the first supply node and a first intermediate node, wherein sources of the first and second p-channel transistors are connected to said output of the corresponding one of the charge pump stage circuits and wherein a gate of the first p-channel transistor is connected to the first intermediate node and a gate of the second p-channel transistor is connected to the first supply node;
a first n-channel transistor coupled between the first intermediate node and a second intermediate node and having a gate connected to the first supply node; and
a second n-channel transistor coupled between the second intermediate node and the second supply node and having a gate connected to receive an actuation control signal output by the discharge control circuit; and
a third p-channel coupled between the first supply node and the second intermediate node and having a gate connected to receive said actuation control signal output by the discharge control circuit.

12. The circuit of claim 7, wherein each of the first and second switched discharge circuits comprises:
a first supply node;
a second supply node;
a plurality of transistors having source-drain paths coupled in series between the first and second supply nodes, wherein said plurality of transistors comprises:
a first p-channel transistor and second p-channel transistor coupled in series between the first supply node and a first intermediate node, wherein sources of the first and second p-channel transistors are connected to said output of the corresponding one of the charge pump stage circuits and wherein a gate of the first p-channel transistor is connected to the first intermediate node and a gate of the second p-channel transistor is connected to the first supply node;
a first n-channel transistor coupled between the first intermediate node and a second intermediate node and having a gate connected to the first supply node;
a second n-channel transistor coupled between the second intermediate node and a third intermediate node and having a gate connected to receive an actuation control signal output by the discharge control circuit; and
a third n-channel transistor coupled between the third intermediate node and the second supply node and having a gate connected to receive said actuation control signal output by the discharge control circuit;
a third p-channel coupled between the first supply node and the second intermediate node and having a gate connected to receive said actuation control signal output by the discharge control circuit; and
a fourth p-channel coupled between the first supply node and the third intermediate node and having a gate connected to receive said actuation control signal output by the discharge control circuit.

13. The circuit of claim 7, wherein the charge pump circuit is a positive voltage charge pump.

14. The circuit of claim 7, wherein the charge pump circuit is a negative voltage charge pump.

15. A circuit, comprising:
a charge pump circuit including a plurality of charge pump stage circuits coupled in series; and
a discharge circuit configured to discharge the charge pump circuit;
wherein the discharge circuit comprises:
a plurality of switched discharge circuits, where each switched discharge circuit is coupled to an output of a corresponding one of the charge pump stage circuits and configured, when actuated, to discharge said output; and
a discharge control circuit configured to sequentially actuate each switched discharge circuit of the plurality of switched discharge circuits over a discharge time period;
wherein the discharge circuit further comprises a plurality of clock gating circuits, wherein each clock gating circuit is configured to selectively pass a charge pump clock signal to a corresponding one of the charge pump stage circuits, and wherein the discharge control circuit is configured to control the clock gate circuit to block the charge pump clock signal for said corresponding one of the charge pump stage circuits simultaneously with actuation of the switched discharge circuit for the same said corresponding one of the charge pump stage circuits.

16. The circuit of claim 15, further comprising:
a clock generator circuit configured to generate said charge pump clock signal;
a sensing circuit configured to sense a voltage at the output of a last one of the charge pump stage circuits in said plurality of charge pump stage circuits and generate a feedback voltage from said sensed voltage;
wherein said clock generator circuit is enabled for operation when said feedback voltage is less than a reference voltage.

17. The circuit of claim 16, wherein the reference voltage is a bandgap voltage.

18. The circuit of claim 15, wherein the discharge control circuit controls sequential actuation of the switched discharge circuits over the discharge time period such that the output of a given one of the charge pump stage circuits is fully discharged to a certain voltage level before a subsequent one of the charge pump stage circuits is discharged.

19. The circuit of claim 15, wherein the charge pump circuit is a positive voltage charge pump.

20. The circuit of claim 15, wherein the charge pump circuit is a negative voltage charge pump.

21. A circuit, comprising:
a charge pump circuit including a plurality of charge pump stage circuits coupled in series; and
a discharge circuit configured to discharge the charge pump circuit;
wherein the discharge circuit comprises:
 a plurality of switched discharge circuits, where each switched discharge circuit is coupled to an output of a corresponding one of the charge pump stage circuits and configured, when actuated, to discharge said output; and
 a discharge control circuit configured to sequentially actuate each switched discharge circuit of the plurality of switched discharge circuits over a discharge time period;
wherein each switched discharge circuit comprises:
 a first supply node;
 a second supply node;
 a plurality of transistors having source-drain paths coupled in series between the first and second supply nodes, wherein said plurality of transistors comprises:
  a first p-channel transistor and second p-channel transistor coupled in series between the first supply node and a first intermediate node, wherein sources of the first and second p-channel transistors are connected to said output of the corresponding one of the charge pump stage circuits and wherein a gate of the first p-channel transistor is connected to the first intermediate node and a gate of the second p-channel transistor is connected to the first supply node;
  a first n-channel transistor coupled between the first intermediate node and a second intermediate node and having a gate connected to the first supply node; and
  a second n-channel transistor coupled between the second intermediate node and the second supply node and having a gate connected to receive an actuation control signal output by the discharge control circuit; and
  a third p-channel coupled between the first supply node and the second intermediate node and having a gate connected to receive said actuation control signal output by the discharge control circuit.

22. The circuit of claim 21, wherein the discharge control circuit controls sequential actuation of the switched discharge circuits over the discharge time period such that the output of a given one of the charge pump stage circuits is fully discharged to a certain voltage level before a subsequent one of the charge pump stage circuits is discharged.

23. The circuit of claim 21, wherein the charge pump circuit is a positive voltage charge pump.

24. The circuit of claim 21, wherein the charge pump circuit is a negative voltage charge pump.

25. A circuit, comprising:
a charge pump circuit including a plurality of charge pump stage circuits coupled in series; and
a discharge circuit configured to discharge the charge pump circuit;
wherein the discharge circuit comprises:
 a plurality of switched discharge circuits, where each switched discharge circuit is coupled to an output of a corresponding one of the charge pump stage circuits and configured, when actuated, to discharge said output; and
 a discharge control circuit configured to sequentially actuate each switched discharge circuit of the plurality of switched discharge circuits over a discharge time period;
wherein each switched discharge circuit comprises:
 a first supply node;
 a second supply node;
 a plurality of transistors having source-drain paths coupled in series between the first and second supply nodes, wherein said plurality of transistors comprises:
  a first p-channel transistor and second p-channel transistor coupled in series between the first supply node and a first intermediate node, wherein sources of the first and second p-channel transistors are connected to said output of the corresponding one of the charge pump stage circuits and wherein a gate of the first p-channel transistor is connected to the first intermediate node and a gate of the second p-channel transistor is connected to the first supply node;
  a first n-channel transistor coupled between the first intermediate node and a second intermediate node and having a gate connected to the first supply node;
  a second n-channel transistor coupled between the second intermediate node and a third intermediate node and having a gate connected to receive an actuation control signal output by the discharge control circuit; and
  a third n-channel transistor coupled between the third intermediate node and the second supply node and having a gate connected to receive said actuation control signal output by the discharge control circuit;
  a third p-channel coupled between the first supply node and the second intermediate node and having a gate connected to receive said actuation control signal output by the discharge control circuit; and
  a fourth p-channel coupled between the first supply node and the third intermediate node and having a gate connected to receive said actuation control signal output by the discharge control circuit.

26. The circuit of claim 25, wherein the discharge control circuit controls sequential actuation of the switched discharge circuits over the discharge time period such that the output of a given one of the charge pump stage circuits is fully discharged to a certain voltage level before a subsequent one of the charge pump stage circuits is discharged.

27. The circuit of claim 25, wherein the charge pump circuit is a positive voltage charge pump.

28. The circuit of claim 25, wherein the charge pump circuit is a negative voltage charge pump.

29. A circuit, comprising:
a charge pump circuit including a plurality of charge pump stage circuits coupled in series; and
a discharge circuit configured to discharge the charge pump circuit;
wherein the discharge circuit comprises:
 a plurality of switched discharge circuits, where each switched discharge circuit is coupled to an output of a corresponding one of the charge pump stage circuits and configured, when actuated, to discharge said output; and
 a discharge control circuit configured to sequentially actuate each switched discharge circuit of the plurality of switched discharge circuits over a discharge time period;

wherein sequential actuation of the switched discharge circuits is controlled by a discharge clock signal and wherein the discharge control circuit comprises:
  a control circuit configured to generate a first actuation signal and the discharge clock signal, wherein the first actuation signal is applied to control actuation of a first one of the switched discharge circuits; and
  a flip flop circuit clocked by the discharge clock signal and having an input configured to receive the first actuation signal and an output configured to generate a second actuation signal that is applied to control actuation of a second one of the switched discharge circuits.

30. The circuit of claim 29, wherein the first one of the switched discharge circuits is coupled to the output of a corresponding first one of the charge pump stage circuits and wherein the second one of the switched discharge circuits is coupled to the output of a corresponding second one of the charge pump stage circuits which is connected in series with the first one of the charge pump stage circuits.

31. The circuit of claim 29, wherein the discharge control circuit controls sequential actuation of the switched discharge circuits over the discharge time period such that the output of a given one of the charge pump stage circuits is fully discharged to a certain voltage level before a subsequent one of the charge pump stage circuits is discharged.

32. The circuit of claim 29, wherein the charge pump circuit is a positive voltage charge pump.

33. The circuit of claim 29, wherein the charge pump circuit is a negative voltage charge pump.

34. A circuit, comprising:
  a charge pump circuit including a first charge pump stage circuit coupled in series with a second charge pump stage circuit; and
  a discharge circuit configured to discharge the charge pump circuit;
  wherein the discharge circuit comprises:
    a first switched discharge circuit coupled to a first output of the first charge pump stage circuit and configured, when actuated, to discharge said first output;
    a second switched discharge circuit coupled to a second output of the second charge pump stage circuit and configured, when actuated, to discharge said second output; and
    a discharge control circuit configured to actuate the first switched discharge circuit to discharge said first output and then, after said first output is fully discharged to a certain voltage level, actuate the second switched discharge circuit to discharge said second output to said certain voltage level;
  wherein the discharge control circuit comprises:
    a control circuit configured to generate a first actuation signal, wherein the first actuation signal is applied to control actuation of said first switched discharge circuit;
    a delay circuit configured to generate a second actuation signal by delaying the first actuation signal, wherein the second actuation signal is applied to control actuation of said second switched discharge circuit.

35. The circuit of claim 34, wherein the delay circuit is a flip flop circuit.

36. The circuit of claim 34, wherein the charge pump circuit is a positive voltage charge pump.

37. The circuit of claim 34, wherein the charge pump circuit is a negative voltage charge pump.

* * * * *